United States Patent [19]

Kubo et al.

[11] 3,983,619

[45] Oct. 5, 1976

[54] LARGE SCALE INTEGRATED CIRCUIT ARRAY OF UNIT CELLS AND METHOD OF MANUFACTURING SAME

[75] Inventors: Masaharu Kubo, Hachioji; Minoru Nagata, Kodaira; Keikichi Moriwaki, Hachioji, all of Japan

[73] Assignee: Hitachi, Ltd., Japan

[22] Filed: Sept. 6, 1973

[21] Appl. No.: 394,631

Related U.S. Application Data

[63] Continuation of Ser. No. 153,015, June 14, 1971, abandoned, which is a continuation of Ser. No. 793,049, Jan. 22, 1969, abandoned.

[30] Foreign Application Priority Data

Jan. 26, 1968 Japan.................................. 43-4656

[52] U.S. Cl.................................. 29/571; 29/577; 357/41; 357/45

[51] Int. Cl.².......................................... B01J 17/00

[58] Field of Search................ 29/577, 577 IC, 571; 357/41

[56] References Cited

UNITED STATES PATENTS 3,365,707   1/1968   Mayhew.............................. 357/41

Primary Examiner—W. Tupman
Attorney, Agent, or Firm—Craig & Antonelli

[57] ABSTRACT

A semiconductor LSI array comprising a plurality of unit cells arranged in rows, each of which cells has operation terminals, input terminals and output terminals positioned in a standardized relation. A set of runways are provided on the unit cells for each row so that the runways may be connected to corresponding operation terminals and that input terminals may be opposed to output terminals with respect to the runways.

11 Claims, 12 Drawing Figures

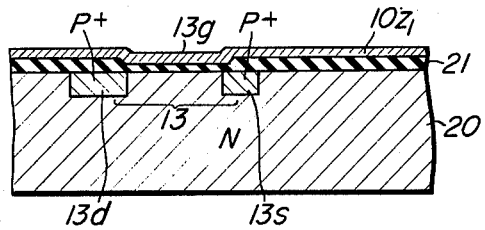
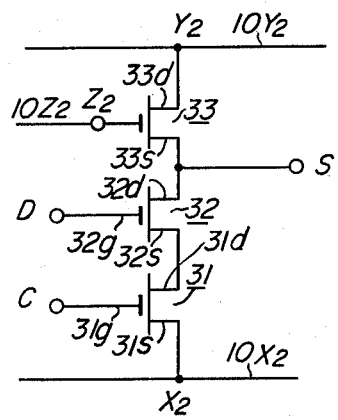
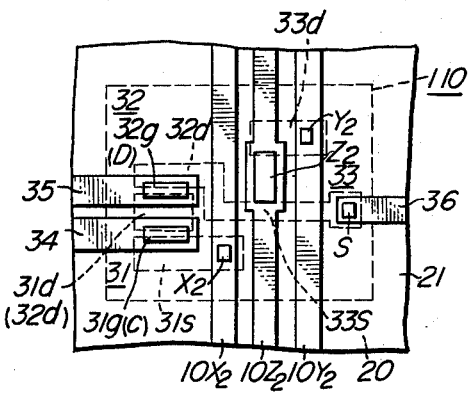
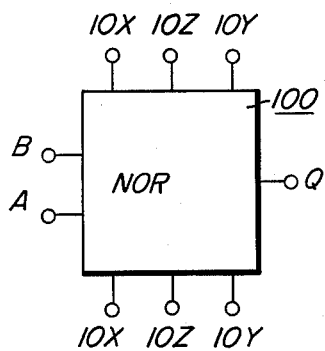
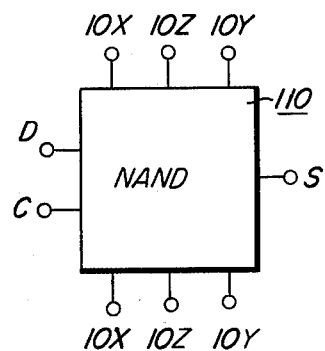

LARGE SCALE INTEGRATED CIRCUIT ARRAY OF UNIT CELLS AND METHOD OF MANUFACTURING SAME

CROSS REFERENCES TO RELATED APPLICATIONS

This is a continuation of application Ser. No. 153,015 filed June 14, 1971, now abandoned which is a continuation of application Ser. No. 793,049, filed Jan. 22, 1969, now abandoned.

BACKGROUND OF THE INVENTION

1. Field of the Invention

The present invention relates to semiconductor integrated circuits, and more particularly to Large Scale Integration (LSI) circuits comprising a plurality of mutually connected unit cells on a single semiconductor wafer.

A semiconductor integrated circuit consists of functional circuits integrally formed on a single semiconductor substrate, so that circuit means using integrated circuits are characterized by their miniaturized dimensions and a remarkably high reliability in operation. Accordingly, the semiconductor integrated circuits are extremely valuable in the field of electronic computers, the main subject of which is to process information with accuracy as well as at a high speed, and thus most of the logic circuits or the like in use are in the form of an integrated circuit. In the field of semiconcuctor integrated circuits, efforts have been made to increase the degree of integration of circuit components to be formed on a single semiconductor substrate with the progress of the integrated circuit manufacturing technique, so that the function of a larger-scale circuit may be performed by a single integrated circuit. In the present specification, the term "unit cell" is used to involve a fundamental functional circuit which is normally used to construct any various system. For example, the unit cell may be an AND circuit, a NAND circuit, an OR circuit, a Flip-Flop circuit or the like, while the term "LSI circuit" is used to involve a circuit consisting of either a plurality of integrated unit cells formed on a single semiconductor substrate or a much greater number of integrated circuit components as compared with a unit cell.

2. DESCRIPTION OF THE PRIOR ART

Conceptually, the LSI circuit is a development of the conventional Integrated Circuit (IC). However, practically, since in the LSI circuit an extremely great number of circuit components must be contained on one substrate, unexpected complication which has not been experienced in the conventional manufacture of integrated circuits arises in carrying out the circuit design and circuit component location for forming an LSI circuit. Therefore, the custom approach to a maximum utility of the area of a substrate by individually designing the component location and metallization connection for each required circuit has been effective in the IC field, but is not practical in the LSI field where the circuit arrangement is much more complicated. One of the strongest reasons why the custom approach is not suited for the LSI is that the design of LSI circuits is intricate resulting in high manufacturing costs since the custom approach necessitates designing, for each individual LSI circuit, both an impurity diffusion mask for forming circuit elements and an interconnection mask for interconnecting the circuit elements.

In order to remove such deficiency present in the custom approach, there have been proposed various approaches for the LSI, and the master slice approach can be given here as example. In the master slice approach, a great number of circuit elements are formed and arranged on a substrate beforehand so as to be able to obtain different LSI circuits by modifying the interconnecting metallization, so that any desired circuits may be completed by suitably connecting the circuit elements having been formed and arranged as described. This approach is, therefore, advantageous in that the same diffusion mask can be used to produce a plurality of kinds of LSI circuits merely by designing masks for effecting metallization, which is the final fabrication step, required for individual LSI circuits. What is most important for the master slice approach is which kind of circuit elements are involved and how they should be arranged. This factor determines the flexibility of an LSI circuit. In view of this fact a proposal was made, which is known from U.S. Pat. No. 3,365,707 granted to Thomas R. Mayhew et al. According to the LSI circuit proposed by T. R. Mayhew, each unit cell is designed to have such a structure that it includes four insulated gate field-effect devices having both committed and uncommitted connections, whereby a system designer is given the flexibility of specifying the functional identity of a cell by means of the design connection pattern of the various uncommitted connecting points. In the LSI circuit by Mayhew et al, though unit cells have the same structure, they can be modified so as to have different functional identities depending upon the way of interconnecting the same, and therefore high flexiblity or adaptability is provided for designing any LSI circuit.

However, since the LSI structure by Mayhew et al is in accordance with the master slice system, extra elements which are unnecessary for a desired LSI circuit construction are necessarily formed on a semiconductor substrate. As a result, the utility of the substrate area is disadvantageously poor. Furthermore, this structure is defective in that the number of and the number of kinds of circuit elements capable of being included in each unit cell are limited so that a desired LSI circuit can not be obtained, or if the latter is obtained the wiring design would be too complicated, and many useless elements tend to be formed additionally.

SUMMARY OF THE INVENTION

The principal object of the present invention is to provide an LSI array of unit cells which is novel in structure, is capable of performing a desired function and is still easy to design on a substrate with a high density.

Each of the unit cells in accordance with the present invention may include a plurality of field-effect devices having source, drain and gate regions respectively and is formed in suitable integrated circuit configuration depending upon desired functional identities so that the unit cells constituting the present LSI need not always be of the same kind.

The present invention consists in a specific arrangement of operation terminals, input terminals and output terminals for each of the unit cells constituting the LSI array. Throughout the present specification, the term "operational terminal" involves terminals that are connected to sources which deliver an operation voltage, ground voltage, clock pulses, etc. which are fed in common to the plurality of unit cells. Therefore, the operation terminals are adapted to be connected with sets of runways formed along the unit cells. In the present invention, the unit cells are arranged in rows on a semiconductor substrate while the abovementioned sets of runways are formed on the rows of unit cells. Further, in each of the unit cells, operation terminals are disposed under a set of runways so as to be connected therewith, and input and output terminals are positioned on one side of and on the other side of the set of runways respectively so that the signal path may be transverse to the runways. Also, interconnections between field-effect devices in the same unit cell are mainly carried out by means of diffused internal connectors while interconnections for signal transference between different unit cells and formation of runways are carried out by means of metal conductors formed on an insulating layer covering the surface of the substrate. As a consequence, according to the present invention, it is possible for an LSI circuit to have respective unit cells positioned on a semiconductor substrate in association with the logic diagram representative of the whole function of the LSI circuit, so that the design of pattern masks can be easily done.

BRIEF DESCRIPTION OF THE DRAWINGS

FIGS. 3, 4, 5 and 6 are sectional views of the unit cell portion of FIG. 2 taken along lines III—III, IV—IV, V—V and VI—VI;

FIG. 7 shows an example of a diagram of a NAND circuit constituted by field-effect transistors;

FIG. 8 is a plan view of a unit cell portion of another embodiment of the LSI circuit in accordance with the present invention and is equivalent to the NAND circuit of FIG. 7;

FIGS. 9 and 10 are symbols equivalent to the unit cells of FIGS. 2 and 8 respectively.

DESCRIPTION OF THE PREFERRED EMBODIMENTS

The object, construction and functional effect of the present invention will be apparent from the description of some preferred embodiments made by reference to the drawings.

Figure 1:
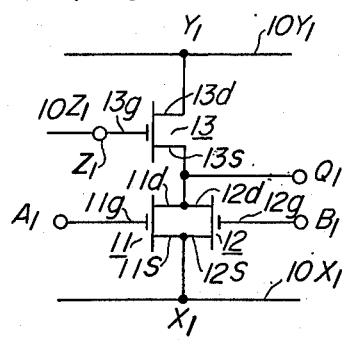
FIG. 1 shows an example of a diagram of a NOR circuit constituted by field-effect transistors.

FIG. 1 is an example of a circuit, a two-input NOR circuit, which may be formed in a unit cell, and comprises field-effect transistors (hereinafter referred to as FET) 11, 12 and 13 having a p-type channel. The FET's 11 and 12 have their sources $11s$ and $12s$ connected with an operation terminal $X_1$ at the ground potential and have their drains $11d$ and $12d$ connected to an operation terminal $Y_1$ at a negative potential through the FET 13. The FET 13 has its gate $13g$ connected with an operation terminal $Z_1$ at a suitably negative potential so as to operate as a resistive element. The gates $11g$ and $12g$ of the FET's 11 and 12 are connected with input terminals $A_1$ and $B_1$ respectively, and an output terminal $Q_1$ is further connected with the drains $11d$ and $12d$ of the FET's 11 and 12 so that the unit cell may receive inputs from the input terminals $A_1$ and $B_1$ and deliver the corresponding NOR output at the output terminal $Q_1$. Also, in FIG. 1, reference marks $10X_1$, $10Y_1$ and $10Z_1$ denote runways to be connected with the operation terminals $X_1$, $Y_1$ and $Z_1$ respectively.

Figure 2:
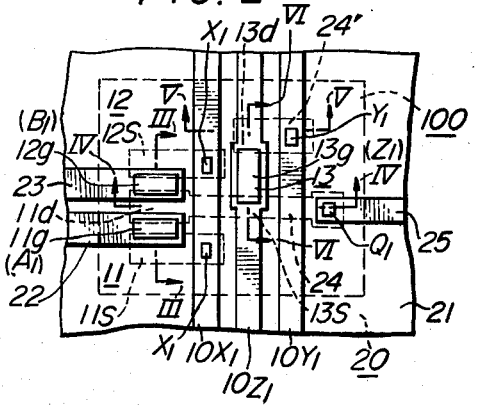
FIG. 2 is a plan view of a unit cell portion of an embodiment of the LSI circuit in accordance with the present invention and is equivalent to the NOR circuit of FIG. 1.
Figure 3:
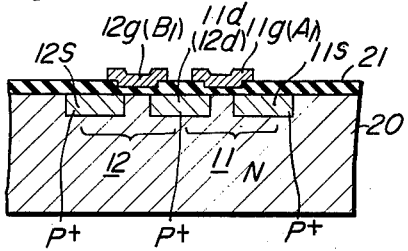
Figure 4:
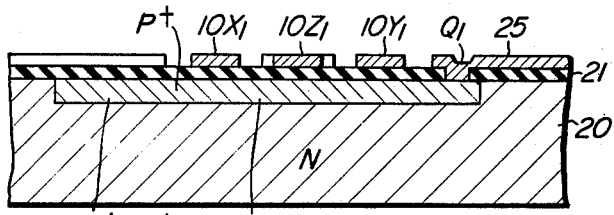
Figure 5:
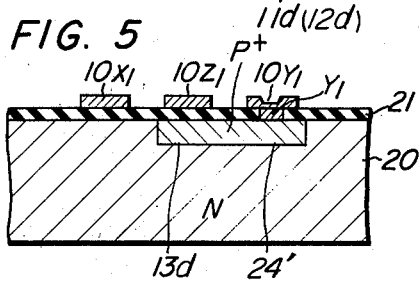

According to the present invention, the above-mentioned NOR circuit can be integrated (i.e., can be formed into an integrated circuit) on a semiconductor substrate 20, as shown in FIG. 2. The FET's 11, 12 and 13 are formed within a unit region 100 (defined by chain lines). The runways $10X_1$, $10Y_1$ and $10Z_1$ are so formed as to traverse the central portion of the unit region 100. In FIG. 2, the respective constituent parts of the FET's 11, 12 and 13 are indicated by the same reference marks as in FIG. 1, and the drains $11d$ and $12d$ of the FET's 11 and 12 are illustrated as a combined region denoted merely by $11d$. As can be clearly seen from FIG. 3 showing a sectional view of the FET's 11 and 12 taken along line III—III, regions for the sources $11s$ and $12s$ and the drain $11d$ ($12d$) consist of p-type diffused regions in the surface of an n-type semiconductor substrate 20 while regions for the gates $11g$ and $12g$ consist of metal layers formed at those positions on an insulating layer 21 covering the surface of the substrate 20 which are positioned above the respective channels defined by the drain $11d$ ($12d$) and the sources $11s$ and $12s$ of the FET's 11 and 12. The gate regions $11g$ and $12g$ serve as the input terminals $A_1$ and $B_1$ respectively and located at the left side part of the unit region 100 so as to be connected to input connectors 22 and 23 respectively. The operation terminal $X_1$, to which the source region $11s$ and $12s$ of the FET's 11 and 12 are connected, is positioned below the runway $10X_1$ and connected thereto through apertures provided in the insulating layer 21. The output terminal $Q_1$ is located at the right side part of the unit region 100. As can be seen from FIG. 4 showing a sectional view taken along line IV—IV of FIG. 2, the output terminal $Q_1$ is coupled with the drain region $11d$ ($12d$) of the FET 11 (12) below the insulating layer 21 through the diffused internal connector 24. 25 is an output connector for coupling a signal derived from the output terminal $Q_1$ with another unit cell and is constituted by a metal layer formed on the insulating layer. The runways $10X_1$ $10Y_1$ and $10Z_1$ are formed on the insulating layer 21 respectively. As shown in FIGS. 5 and 6 which are sectional views taken along lines V—V and VI—VI of FIG. 2, the FET 13 has a drain region $13d$ consisting of a part of an internal connector $24'$, a source region $13s$ consisting of a part of the internal connector 24 and a gate region $13g$ formed at that position on the insulating layer 21 which is above the channel defined by the regions $13d$ and $13s$. The gate region $13g$ further extends to form the operation terminal $Z_1$ so located as to be connected to the runway $10Z_1$. Also, the drain region $13d$ is connected to the runway $10Y_1$ through the internal connector $24'$ and the operation terminal $Y_1$.

FIG. 7 is another example of a circuit, a two-input NAND circuit, which may be formed in a unit cell, and comprises FET's 31, 32 and 33. In this circuit, the FET 31 has its gate $31g$ connected with an input terminal C, its drain $31d$ connected with the source $32s$ of the FET 32 the gate $32g$ of which is connected with an input terminal D, and its source $31s$ connected with an operation terminal $X_2$ which is supplied with the ground potential. The drain 32d of the FET 32 is connected, through the FET 33 adapted to operate as a resistive element, to an operation terminal $Y_2$ which is supplied with a negative potential. The FET 33 has its gate 33g connected with an operational terminal $Z_2$ which is supplied with a negative potential, its source 33s connected with an output terminal S and its drain 32d connected with the operation terminal $Y_2$. Therefore, the unit cell receives inputs applied to the input terminals C and D and delivers the corresponding NAND output at the output terminal S. Reference marks $10X_2$, $10Y_2$ and $10Z_2$ denote runways for applying corresponding voltages to operation terminals $X_2$, $Y_2$ and $Z_2$.

According to the present invention, the above-mentioned NAND circuit can be integrated on a semiconductor substrate 20 as shown in FIG. 8, where the respective circuit constituent parts are indicated by the same reference marks as in FIG. 7. In the NAND circuit unit cell of the present invention, like in the above-mentiond NOR circuit unit cell, runways $10X_2$, $10Y_2$ and $10Z_2$ are so formed as to traverse the central portion of a unit region 110, the operation terminals $X_2$, $Y_2$ and $Z_2$ are positioned directly below corresponding runways, the input terminals C and D are located at the left side part of the unit region 110 while the output terminal S is located at the right side part of the unit region 110. Here, the positioning of the respective operation terminals $X_2$, $Y_2$ and $Z_2$ is so defined that the runways $10X_2$, $10Y_2$ and $10Z_2$ are aligned in the same order as the runways $10X_1$, $10Y_1$ and $10Z_1$ in the NOR circuit unit cell of FIG. 2. Thus, also in the unit cell of FIG. 8 the signal path is transverse to the set of runways. In FIG. 8, 34 and 35 are input connectors connected with the input terminals C and D, 36 is an output connector connected with the output terminal S, and all of these connectors are made of metal layers formed on an insulating layer 21.

As can be understood from the above-described NOR circuit unit cell and NAND circuit unit cell and a comparison between them, a feature of the present invention lies in that in both unit cells the operation terminals are formed at such positions that the terminals may be connected with their corresponding ones of runways arranged in the same order, and in that input terminals are formed at one side of a corresponding set of runways passing the central portion of a unit cell while output terminals are formed at the other side of the corresponding set of runways. Another feature is in that the respective operation, input and output terminals are so formed as to be connected with corresponding runways or connectors at the surface of an insulating layer.

Consequently, the above-described unit cells in accordance with the present invention may be equivalently represented by the symbols as shown in FIGS. 9 and 10 respectively. In FIGs. 9 and 10, the runways of both of the unit cells 100 and 110 are denoted by the same 10X, 10Y and 10Z since both of the unit cells 100 and 110 may be powered or supplied with operation voltage or the like through the same set of runways.

Figure 11:
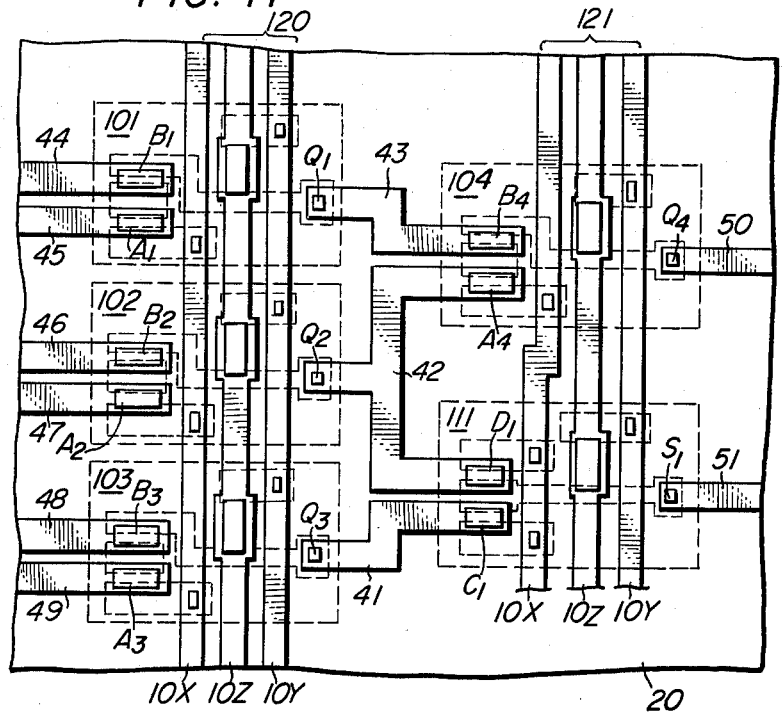
FIG. 11 is a plan view of a part of an LSI circuit embodying the present invention.

In the LSI array of unit cells in accordance with present invention, the positional relation between operation, input and output terminals is specifically defined in each unit cell, so that inerconnections between unit cells can be performed extremely systematically as illustrated, for example, in FIG. 11.

Referring to FIG. 11 showing a part of a logic circuit, in each of unit regions 101–104 is formed a NOR circuit similar to what is shown in FIG. 2 while in a unit region 111 is formed a NAND circuit similar to what is shown in FIG. 8. The unit cells 101–111 are arranged in two rows, and sets of runways 120 and 121 are provided for the two rows respectively. Although not illustrated in the figure, the respective runways are connected with outer operation pads so as to be coupled with corresponding runways at peripheral portions of the semiconductor substrate 20. Signal transference interconnection between one row and the adjacent row is indicated by 41, 42 and 43. Input terminals $A_1$, $B_1$, $A_2$, $B_2$, $A_3$, $B_3$ of the unit cells 101, 102 and 103 in the first row are supplied with input signals through input connectors 44–49 the leading ends of which are, though not shown, connected with either output terminals of unit cells in the adjacent row or outer input pads formed at peripheral portions of the semiconductor substrate. Similarly, output terminals $Q_4$ and $S_1$ of the unit cells 104 and 111 are connected with either input terminals of unit cells in the adjacent row or outer output pads through connectors 50 and 51.

Figure 12:
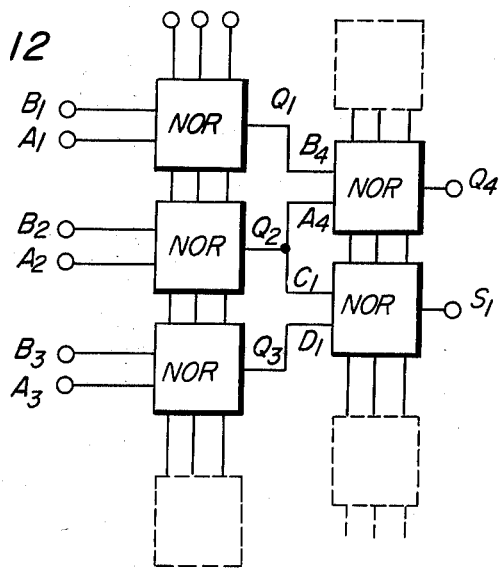
FIG. 12 is a diagram equivalent to the LSI circuit of FIG. 9 and is depicted with the same symbols as used in FIGS. 9 and 10.

The LSI circuit of FIG. 11 can be represented as shown in FIG. 12, and operates as a logic circuit capable of performing the following operation expressed in terms of Boolean algebra where marks as used in FIG. 12 are used:

$$Q_4 = \overline{A_4 + B_4} = (A_1 + B_1) \cdot (A_2 + B_2)$$

$$S_1 = \overline{C_1 \cdot D_1} = A_2 + A_3 + B_2 + B_3$$

In other words, the part of the LSI circuit shown in FIG. 11 and made by a simple combination of unit cells can provide at the output terminal $Q_4$ an AND output of two OR outputs $(A_1 + B_1)$ and $(A_2 + B_2)$, and at the output terminal $S_1$ and OR output of of $A_2$, $B_2$, $A_3$ and $B_3$.

It can be understood from the above-described embodiments of the present invention that there exist only a small number of intersections between the signal transference conductors consisting of metal layers for connecting unit cells and between the signal transference conductors and the runways, and that in each unit cell input terminals and output terminals are shielded from each other by runways resulting in stabilization of the operation of the circuit due to absence of mutual interference of signals.

Generally, in forming a rather simplified LSI circuit, one signal may be fed to a plurality of unit cells in different rows which need a multilayer structure if one wishes to carry out signal transference connection only by means of metal layers avoiding contacts between signal transference connectors and runways. In such a case, according to the present invention, diffused internal connectors may be formed within those parts of a semiconductor substrate which are disposed between unit regions for the purpose of an effective circuit connection.

In the present invention, all of the unit cells necessary for constituting an LSI circuit are designed beforehand so as to have input terminals and output terminals at opposed sides of a set of runways as seen from the NOR circuit and NAND circuit described above and the unit cells are laid out referring to a desired logic circuit such as shown in FIG. 12 by substituting unit cells for the corresponding logic parts of the logic circuit whereby a desired LSI circuit is formed. Patterns of impurity diffusion masks for the desired LSI circuit are obtained by associating the same as those previously prepared for the respective unit regions, and further, if necessary, auxiliary interconnection patterns may be incorporated. As for mask patterns for connection by metal, the simple arrangement of runways can be performed very easily, and wiring or connection of the signal path is also very easy because basically, mere connection of unit cells along the signal paths will suffice therefor, as can be seen from FIGS. 11 and 12. Therefore, the manufacture of LSI circuits becomes very fast and easy.

What we claim is:

1. A method for fabricating an LSI array of a desired function comprising the steps of:
 a. designing a logical block diagram representative of the desired function of the LSI circuit;
 b. determining necessary unit cells sufficient to constitute the desired LSI array, each unit cell occupying a predetermined area of a semiconductor substrate and having:
  1. a plurality of field effect devices formed in the semiconductor area and integrally interconnected to each other so as to perform a specific function as a whole,
  2. a set of conductor runways formed on an insulating layer and over the unit cell which covers the semiconductor area and extending in parallel with each other in one direction across the semiconductor area, said runways being connected to said field effect devices so as to cause said field effect devices to be operative,
  3. at least one input terminal provided on the insulating layer at one side of the set of said runways and connected to one of the field effect devices for receiving an input signal for the unit cell, and
  4. at least one input terminal provided on the insulating layer at the other side of the set of the runways and connected to one of the field effect devices for outputting an output signal of the unit cell, so that each cell is recognized as a black box of a specific function with parallel runways thereacross and with input and output terminals at opposite sides of the set of the runways;
 c. laying out the determined constitutent unit cells in at least one row therewith in such a manner that the runways of each set in said row of the unit cells are aligned substantially with each other, so that input and output terminals of the respective unit cells in said row are disposed at opposite sides of the aligned sets of the runways, said layout being performed in accordance with the same design as that of said logical block diagram; and
 d. designing metal conductor patterns for connecting between the input and output terminals of the respective unit cells so as to constitute the desired LSI array with the unit cells, whereby flexibility in the layout of the unit cells without consideration of power supply to the unit cells is attained.

2. A method of manufacturing a large scale integrated circuit array of unit cells comprising the steps of:
 a. designing a logical block diagram representative of a desired function of the large scale integrated circuit;
 b. arranging, in a first direction in a semiconductor substrate, a plurality of unit cell regions, each unit cell region being made of a plurality of insulated gate field effect transistors, each of which has a source and a drain region spaced apart from one another and disposed in the major surface of said substrate, and an insulated gate region disposed above a channel portion of said substrate on an insulating film formed on a major surface of said substrate between said source and drain regions, said arrangement of the unit cell regions being performed in accordance with the same design as that of said logical block diagram;
 c. forming, in the major surface of said substrate, internal connector regions which internally connect the source and drain regions of all field effect transistors of each respective unit cell into a prescribed fixed pattern corresponding to an operational function to be effected by the respective unit cell;
 d. connecting, with at least one of the gate regions of each respective unit cell, an input terminal and disposing said input terminal on the surface of said insulating film;
 e. connecting, with at least one of the source and drain regions of each respective unit cell, an output terminal and disposing said output terminal on the surface of said insulating film;
 f. providing a set of parallel extending conductor runways on said insulating film above the unit cells arranged in said first direction defined in step (b), between said input and output terminals of each unit cell, said set of parallel extending conductor runways including a first runway extending above a channel portion of at least one of the field effect transistor in each respective unit cell, so that said first runway serves as the gate region of said one of the field effect transistors; and
 g. selectively disposing operation terminals between some of the internal connector regions and said runways through said insulating film, so that the respective unit cells will effect said corresponding operational functions and are provided with input terminals on one side of said conductor runways and output terminals on the other side of said runways.

3. A method according to claim 2, wherein said step (c) comprises the step of introducing impurities, of the same conductivity type as that of the source and drain regions of said unit cells, into said substrate, so as to be contiguous with the source and drain regions to be internally connected into said prescribed pattern.

4. A method according to claim 2, wherein said step (e) comprises the step of introducing impurities, of the same conductivity type as that of the source and drain regions of said unit cells, into said substrate, so as to be contiguous with at least one selected source or drain region and to extend along the surface of said substrate to the portion thereof beneath said output terminal.

5. A method according to claim 2, wherein at least one of the source and drain regions of at least one of said unit cells is formed so as to be disposed beneath said first runway adjacent said channel portion and is connected to one of said operation terminals of a selected runway adjacent said first runway.

6. A method according to claim 5, wherein said step (c) comprises forming an internal connection region to extend beneath said first runway adjacent said channel portion and beneath said selected runway and to extend to and be contacted by said output terminal.

7. A method according to claim 2, further including the steps of repeating steps (b) – (g) for an additional plurality of unit cells aligned in said first direction but spaced apart from said first mentioned plurality of unit cells by a prescribed distance in a direction orthogonal to said first direction, and selectively forming interconnecting conductor layers between selected output terminals of said first mentioned plurality of unit cells and selected input terminals of said additional plurality of unit cells.

8. A method of manufacturing a large scale integrated circuit array of unit cells, comprising the steps of:

a. designing a logical block diagram representative of desired function of the large scale integrated circuit;

b. arranging, in a first direction in a semiconductor substrate, a plurality of unit cell regions, each unit cell region being made of a plurality of insulated gate field effect transistors, each of which has a source and a drain region spaced apart from one another and disposed in the major surface of said substrate, and an insulated gate region disposed above a channel portion of said substrate on an insulating film formed on the major surface of said substrate between said source and drain regions, said arrangement of the unit cell regions being performed in accordance with the same design as that of said logical block diagram;

c. forming, in the major surface of said substrate, internal connector regions which internally connect the source and drain regions of all of the field effect transistors of each respective unit cell into a prescribed fixed pattern corresponding to an operational circuit function to be effected by the respective unit cell;

d. connecting, with at least one of the gate regions of each respective unit cell, an input terminal and disposing said input terminal on the surface of said insulating film and extending said terminal in a second direction orthogonal to said first direction;

e. connecting, with at least one of the source and drain regions of each respective unit cell, an output terminal and disposing said output terminal on the surface of said insulating film and extending said output terminal in said second direction;

f. providing a set of substantially parallel extending conductor runways on said insulating film above the unit cells arranged along said first direction, between said input and output terminals of each unit cell, so as to isolate said input and output terminals with respect to each other on opposite sides of said set of runways, said set of runways including first and second runways connected to respective ones of the source and drain regions of the plurality of insulated gate field effect transistors making up a cell, and a third runway extending above a channel portion of one of the gate regions of a field effect transistor;

whereby said large scale integratd circuit array is made up of unit cells having their respective sets of runways in an alignment with one another for those cells disposed in the same direction arrangement, corresponding to a row of cells, and their input and output terminals disposed adjacent one another for cells disposed in adjacent row arrangements to provide interconnections therebetween.

9. A method according to claim 8, wherein at least one of the source and drain regions of at least one of said unit cells is formed so as to be disposed beneath one of said first and second runways adjacent said channel portion and is connected to one of said first and second runways.

10. A method according to claim 9, wherein said step (c) comprises forming an internal connector region to extend beneath each of said runways, to be adjacent said channel portion and to extend to and be contacted by said output terminal.

11. A method according to claim 8, further including the steps of repeating steps (b) – (f) for an additional plurality of unit cells aligned in said first direction but spaced apart from said first mentioned plurality of unit cells by a prescribed distance in a direction orthogonal to said first direction, and selectively forming interconnecting conductor layers between selected output terminals of said first mentioned plurality of unit cells and selected input terminals of said additional plurality of unit cells.

* * * * *